United States Patent [19]
Masuda et al.
[11] 3,845,444
[45] Oct. 29, 1974

[54] GALVANO-MAGNETRO EFFECT DEVICE

[75] Inventors: Noboru Masuda, Saitama; Yu Nishino, Yokohama; Hisashi Takiguchi, Tokyo, all of Japan

[73] Assignee: Denki Onkyo Co., Ltd., Tokyo, Japan

[22] Filed: June 11, 1973

[21] Appl. No.: 368,623

[52] U.S. Cl. .............................. 338/32 R, 338/32 H
[51] Int. Cl. .............................................. H01c 7/16
[58] Field of Search ....... 338/32 R, 32 H; 323/94 H; 324/45, 46

[56] References Cited
UNITED STATES PATENTS

| | | | |
|---|---|---|---|
| 3,042,887 | 7/1962 | Kuhrt et al. | 338/32 H |
| 3,146,317 | 8/1964 | Kuhrt et al. | 338/32 H |
| 3,192,471 | 6/1965 | Kuhrt et al. | 338/32 H |
| 3,265,959 | 8/1966 | Wiehl et al. | 338/32 H X |

*Primary Examiner*—C. L. Albritton
*Attorney, Agent, or Firm*—Armstrong, Nikaido & Wegner

[57] ABSTRACT

A galvano-magneto effect device in which a galvano-magnetro effect element is fixed on a thin substrate and a thick cover plate made of ferrite is provided on said galvano-magneto effect element.

9 Claims, 10 Drawing Figures

GALVANO-MAGNETRO EFFECT DEVICE

BACKGROUND OF THE INVENTION

The present invention relates to a galvano-magneto effect device to be employed as a magneto-resistance effect device or Hall effect device.

The conventional galvano-magneto effect device as shown in FIG. 10 is made up by bonding a wafer made of a semiconductor material onto substrate 100, grinding said wafer, shaping the ground wafer in a specified form to make galvano-magneto effect element 101, connecting lead wires 102 to ends of said galvano-magneto effect element and fixing cover plate 103 made of a magnetic material such as ferrite on the center of element 101.

In case of such the device, cover plate 103 is directly bonded to the surface of a semiconductor layer of galvano-magneto effect element 101 and accordingly the galvano-magneto effect element may be damaged when securing the cover plate on the element. Since the lead wires are only bonded to the terminals of the galvano-magneto effect element, the lead wires may be disconnected or may come off from the bonded portions when the device is installed in an equipment or is transported.

Furthermore, in the conventional device, substrate 100 is generally made in the thickness of approximately 0.5 mm to 1 mm; accordingly, if the permissible thickness error of the substrate is 1 percent, the maximum error of thickness is 5 $\mu$ – 10 $\mu$. On the other hand, the thickness of the galvano-magneto effect element is generally 1 $\mu$ to 20 $\mu$. It is known that the thinner the thickness of the element is, the better the Hall effect, that is, the galvano-magneto effect of the element becomes and therefore the element is preferable to be as thinner as possible. However, the element is generally made up by grinding the wafer to a thin thickness after fixing a thick semiconductor wafer on the substrate and the thickness of the element is obtained by measuring the thickness of the substrate and element which are joined. If the surface of the substrate is slanted, the thickness of the element is not uniform, or if the thickness of the substrates of a great number of devices is uneven, the thickness of the elements differs with the devices. Thus, the grinding accuracy of the element depends on the thickness accuracy of the substrate. Accordingly, in case of a thick substrate as described above, the maximum error of the thickness of the substrate is large and the irregularity in the thickness of the element becomes extremely large if it is necessary to make the element thin. For this reason, the thickness of the element cannot be fully controlled, the devices with uniform characteristic cannot be obtained and each device cannot have excellent characteristic.

SUMMARY

The present invention provides a galvano-magneto effect device comprising a galvano-magneto effect element comprising a semiconductor layer made of a magnetism sensing semiconductor material such as, for example, indium antimonide which is provided with electrodes, a substrate which is provided with said galvano-magneto effect element on its surface and is made to be thin in a thickness, that is, 60 to 300 $\mu$ so that the thickness of the semiconductor layer is not included in the range of absolute error in the thickness of the substrate when the thickness of the galvano-magneto effect element is controlled in the total value of the thickness of the galvano-magneto effect element and the substrate in making said semiconductor layer and a cover plate made of ferrite which is attached to said galvano-magneto effect element to cover said galvano-magneto effect element and is made thick, that is, in a thickness of at least 1mm, at which the magnetic permeability is saturated in reference to the variation of thickness, wherein said galvano-magneto effect element is interpositioned between the substrate and cover plate.

BRIEF DESCRIPTION OF THE DRAWINGS

The present invention is illustrated in detail by the accompanying drawings whereon.

DETAILED DESCRIPTION OF THE INVENTION

Figure 1:
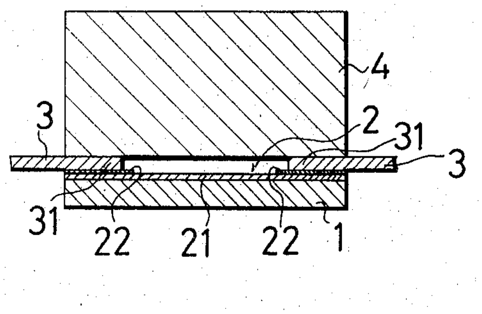
FIG. 1 is a cross sectional view of the device in accordance with the present invention.

Referring to FIG. 1, there is shown an embodiment of the device in accordance with the present invention.

Figure 2:
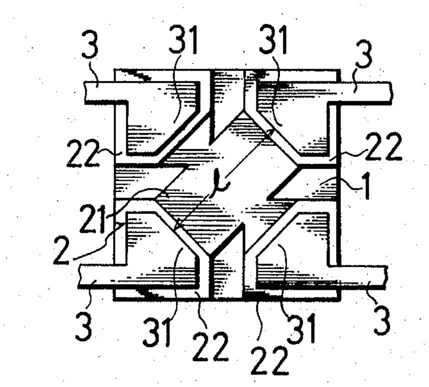
FIGS. 2 and 3 are respectively a plan view showing an embodiment of the galvano-magneto effect element to which lead frames are attached.
Figure 3:
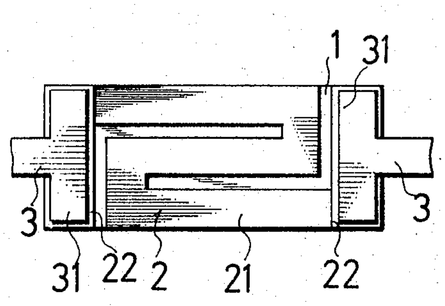

Galvano-magneto effect element 2 which is made in a specified shape is provided on the surface of substrate 1. Galvano-magneto effect element 2 is comprised of thin semiconductor layer 21 which is made of a semiconductor material such as indium antimonide, indium arsenide or gallium arsenide having large Hall effect, that is, galvano-magneto effect in a specified shape and of, a plurality of electrodes 22 which are formed at the specified both ends of the semiconductor layer by coating with a conductive material such as indium. If galvano-magneto effect element 2 is employed as a Hall effect device, it is generally provided with four electrodes 22 as shown in FIG. 2, thereby one pair of opposing electrodes are utilized as the current terminals and the other pair of electrodes as the Hall electromotive voltage terminals. If the galvano-magneto effect element is employed as the magneto-resistance effect device, it is generally provided with two electrodes 22 as shown in FIG. 3.

Said galvano-magneto effect element is connected with lead frames 3 made of a conductive material, each having thin and wide connecting part 31 provided at one end so that connecting parts 31 are overlapped with electrodes 22.

Thick cover plate 4 made of ferrite covers said galvano-magneto effect element and is attached to galvano-magneto effect element 2 with a bonding agent such as epoxy resin so that the cover plate is overlapped with connecting parts 31 of the lead frames so that said lead frames are sandwiched between the element and substrate.

Hereupon, in general, semiconductor layer 21 is obtained by fixing a semiconductor wafer on the surface of substrate 1, grinding this wafer to a specified thickness and forming in a specified shape. A means to form the wafer in a specified shape can be freely selected. For example, a light sensing resist is provided on the wafer and the wafer is formed in a specified pattern. Then the wafer can be etched. Semiconductor layer 21 is made in a thin form to increase the Hall effect, that is, the galvano-magneto effect. However, the minimum thickness of the semiconductor layer is limited due to the strength and grinding possibility. Accordingly, semiconductor layer 21 is made with a thickness from 5 $\mu$ to 20 $\mu$.

Since semiconductor layer 21 is made thin as described above, substrate 1 is also made thin so that the thickness of the semiconductor layer is not included in the range of error thickness of substrate 1. In other words, substrate 1 is made with a thickness in the range of thickness from 60 to 300 $\mu$.

In this case, the thickness of substrate 1 is controlled so that the thickness error is kept within 1 percent and accordingly, the maximum thickness error is 0.6 $\mu$ when the thickness is 60 $\mu$ and 3 $\mu$ when it is 300 $\mu$. The thickness of the semiconductor layer is 5 to 20 $\mu$ and is not therefore included in the thickness error of the substrate. Accordingly, since the grinding accuracy of the semiconductor layer which is made by grinding the wafer is less affected by the thickness accuracy of the substrate, the thickness of the semiconductor layer is easily controlled and even a number of the devices which are mass-produced can be manufactured with the semiconductor layers in uniform thickness.

Substrate 1 can be made of a conventionally known material, which has been employed as the substrate of a magnetism sensing semiconductor, such as, for example, non-magnetic glass or magnetic ferrite.

If a non-magnetic material is employed in the substrate, there is no magnetism concentrating effect of the substrate onto the element when the magnetic field is applied from outside to the semiconductor layer of the galvano-magneto effect element so that the magnetic flux is vertically applied. On the other hand, in case that a magnetic material is employed in the substrate, the magnetic permeability is extremely low because the substrate is thin and the substrate shows a property approximate to that of a non-magnetic material and therefore the magnetic flux concentrating effect of the substrate onto the element is extremely small.

On the contrary, cover plate 4 is made of ferrite and has the magnetic flux concentrating effect on the element. Moreover, cover plate 4 is made in a thick form to compensate the magnetic flux concentrating effect of the substrate which is extremely small or zero and to have a large magnetic flux concentrating effect.

Figure 4:
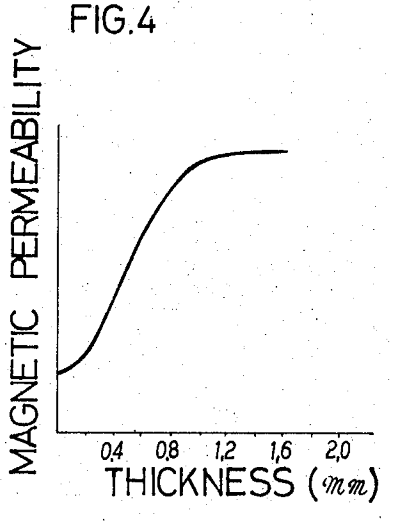
FIG. 4 is a diagram illustrating a characteristic of the cover plate, that is, a graph showing the variation of the magnetic permeability in accordance with the thickness of the cover plate.

The magnetic permeability of a ferrite having thickness of approximately 100 $\mu$ is extremely small as shown in FIG. 4 and becomes larger in accordance with increase of the thickness up to approximately 0.8 mm. In case of the thickness of more than 1 mm, the magnetic permeability of ferrite is saturated and the ferrite shows the intrinsic magnetic permeability of the magnetic material. In other words, the magnetic permeability of ferrite having thickness of more than 1 mm does not depend on the thickness.

Accordingly, cover plate 4 is made in a thickness, that is, at least 1 mm at which the magnetic permeability does not vary with variation of the thickness.

Since the magnetic flux concentrating effect depends on the magnetic permeability of the cover plate, the density of magnetic flux to be applied to the galvano-magneto effect element varies with variation of the magnetic permeability of the cover plate even though an external magnetic field of the device is fixed, and therefore the output voltage of the device varies.

If the thickness of the cover plate is set in the range in which the magnetic permeability suddenly changes in accordance with variation of thickness, the output voltages of the devices become uneven in accordance with unevenness of the thickness of the cover plate. Such the setting of the thickness of the cover plate is not desirable.

Figure 5:
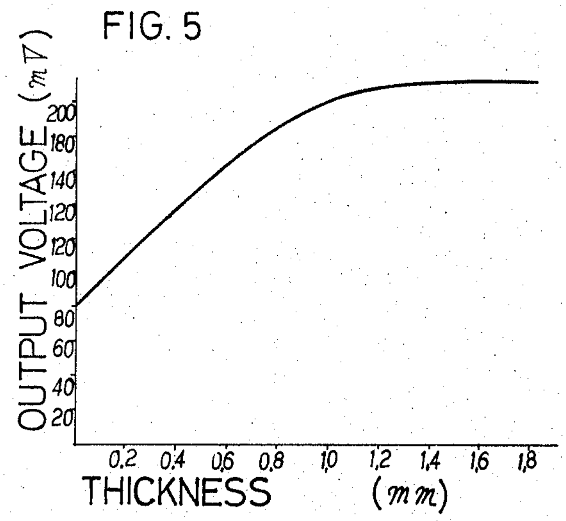
FIG. 5 is a diagram illustrating the characteristic of the device in accordance with the present invention, that is, the variation of the output voltage of the galvano-magneto effect element in accordance with the thickness of the cover plate under a fixed magnetic field.

When the galvano-magneto effect element is used as a Hall effect element and the Hall electromotive output voltage is measured while changing the thickness of cover plate 4 under the following conditions the results shown in FIG. 5 are obtained.

| | |
|---|---|
| Current flowing between the current terminals of the Hall effect element | : 10 mA (fixed) |
| Intensity of magnetic field applied from outside of the device in a direction at a right angle to the element | : 1k gause (fixed) |
| Thickness of the substrate (employing ferrite) | : 0.28 mm |

It is known from this result that the Hall electromotive voltage is saturated at 200 mV in case of the ferrite having thickness of more than approximately 1 mm and the thickness dependability that the Hall electromotive output voltage varies with the thickness is resolved. In other words, if the thickness of the cover plate is set to a valve at which the magnetic permeability does not depend on the thickness, that is, at least 1 mm, the Hall electromotive voltage does not become uneven due to the thickness.

If the galvano-magneto effect element is employed as the magneto-resistance effect element, the variation of resistance in accordance with the intensity of the magnetic field is caused by the Hall effect and therefore the dependability of the variation ratio of resistance on the thickness of the cover plate is the same as the dependability of the Hall electromotive output voltage on the thickness of the cover plate. Accordingly, the dependability of the resistance variation on the thickness can be reduced by setting the thickness of the cover plate to at least 1 mm.

Figure 6:
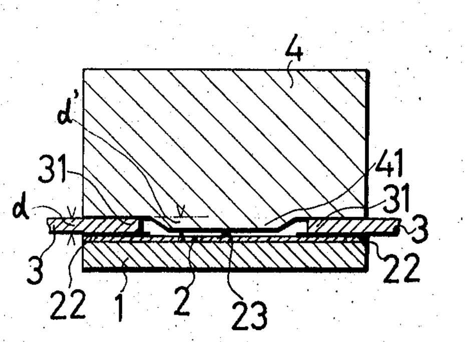
FIG. 6 is a cross sectional view illustrating an embodiment of the cover plate which is provided with a embossed part toward the substrate.

Referring to FIG. 6, there is shown an embodiment in which embossed part 41 opposing to the surface of said galvano-magneto effect element is provided on cover plate 4.

Figure 7:
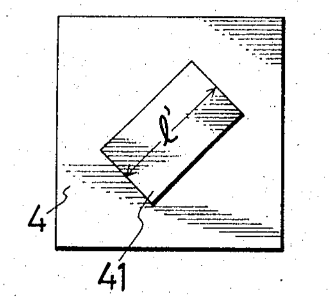
FIG. 7 is a bottom view of the cover plate shown in FIG. 6.

Embossed part 41 is embossed to oppose to a part of said galvano-magneto effect element to which lead frame 3 is not connected, that is, magnetism sensing part 23 except electrode 22. Embossed part 41 is formed in the shape corresponding to the shape of magnetism sensing part 23 of galvano-magneto effect element 2 by the conventionally known etching technique. If an element as shown in FIG. 2 is employed as galvano-magneto effect element 2, embossed part 41 is formed as shown in FIG. 7. Embossed part 41 is made so that it can be inserted between lead frames 3 attached to the electrodes provided in the lengthwise direction of the element or length *l'* of said embossed part is a little shorter than length *l* between the lead frames. Furthermore, embossed part 41 is made so that thickness *d'* is smaller than thickness *d* of lead frame 3.

As described above, embossed part 41 is inserted into a recession formed by connecting the lead frames to the electrodes. Accordingly, alignment of cover plate 4 when it is bonded to galvano-magneto effect element 2 is facilitated. In this case that an epoxy resin is used as a bonding agent, the cover plate does not come off the position even when the viscosity of the bonding agent is lowered by heating the resin for hardening. Moreover, since the surface of embossed part 41 does not contact magnetism sensing part 23 when cover plate 4 is mounted above lead frames 3, the semiconductor part of the galvano-magneto effect element is not damaged and the lead frames can be sandwiched.

Figure 8:
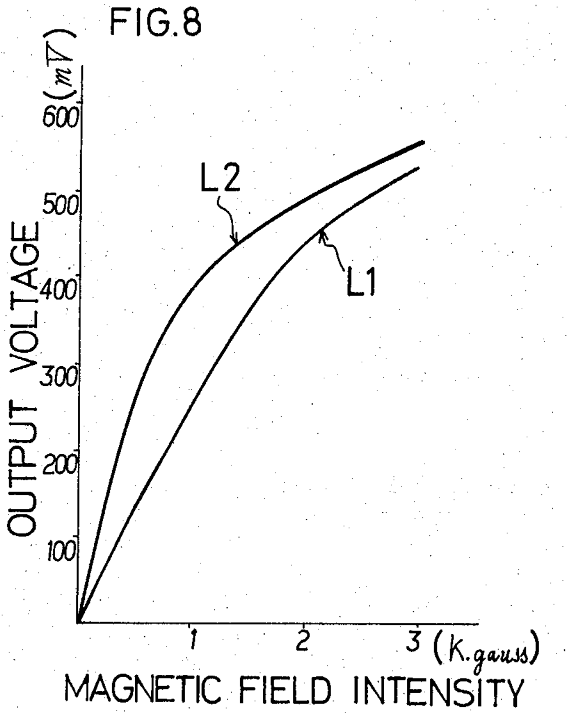
FIG. 8 is a comparison diagram of the characteristic of the device in accordance with the present invention in cases that the cover plate is provided with a embossed part and is not provided with a embossed part, that is, the variation of output voltage of the galvano-magneto effect element in accordance with the variation of the magnetic field intensity.

The results as shown in FIG. 8 were obtained through comparison of the Hall electromotive output voltages of the galvano-magneto effect element in cases that embossed part 41 is provided on cover plate 4 and is not provided by varying the intensity of magnetic field applied from outside the device to the device in the direction at a right angle to the galvano-magneto effect element under the following conditions.

| | |
|---|---|
| Current to be supplied to the galvano-magneto effect element | : 10 mA (fixed) |
| Thickness of ferrite substrate | : 0.28 mm |

In the figure, L1 is the length when cover plate 4 of 1.05 mm thickness is used and the embossed part is not provided and L2 is the length when the embossed part of 0.05 mm thickness is provided on the cover plate of 1 mm thickness.

As known from FIG. 8, the Hall electromotive output voltage becomes large with the embossed part of 0.05 mm thickness provided and this tendency is more remarkable in a low magnetic field. For example, the Hall electromotive output voltage when the embossed part is provided in case of 1 k gauss magnetic field becomes approximately 120 mV larger than that when the embossed part is not provided. Generally, a magnetic field of approximately 1 to 2 k gauss is applied to this type of device and the fact that there is a remarkable output difference under a low magnetic field is effective.

It is considered that the effect that the output becomes large when the embossed part is provided on the cover plate results from that the magnetic field is concentrated onto the magnetism sensing part of the element by the embossed part or the gap between the cover plate and the element is extremely small.

This is the same in case that the galvano-magneto effect element forms a magneto-resistance effect element.

The galvano-magneto effect element can be made by grinding the semiconductor wafer fixed on the substrate or can be formed by evaporating a semiconductor material on the substrate.

Figure 9:
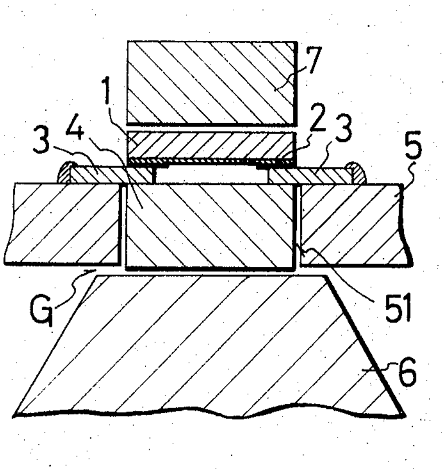
FIG. 9 is a cross sectional view of application for the device in accordance with the present invention.
Figure 10:
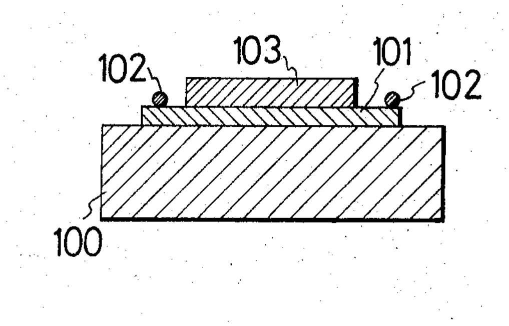
FIG.10 PRIOR ART
FIG. 10 is a cross sectional view of a conventional galvano-magneto effect device.

FIG. 9 shows an example of application of the device in accordance with the present invention which is provided in printed circuit board 5.

Cover plate 4 made of ferrite is made in a thickness equal to or a little larger than the thickness of printed circuit board 5 and is positioned on the inside of through hole 51 provided in printed circuit board. Galvano-magneto effect element 2 and substrate 1 are exposed at one side of printed circuit board 5 and conductive lead frames 3 are bonded to printed circuit board 5.

The galvano-magneto effect device in accordance with the present invention provided on printed circuit board 5 is housed in gap G of the magnetic circuit. In this case, gap G is formed by fixed yoke 6 made of a magnetic material and moving yoke 7 opposed to said fixed yoke.

Since the galvano-magneto effect device is conventionally fixed on the printed circuit board, the gap is large because the printed circuit board is positioned between the gap of the magnetic circuit, the magnetic reluctance is large and the galvano-magneto effect of the device is unsatisfactory. Furthermore, the entire device is exposed on the printed circuit board and may therefore be damaged. Since the substrate or the cover plate is provided on the printed circuit board, the lead wire of the galvano-magneto effect element may be bent or may be broken due to mechanical vibration, etc.

In case of the device in accordance with the present invention, the thickness of the cover plate made of ferrite is equivalent to or slightly larger than the thickness of the printed circuit board, the cover plate can be inserted into the through hole of the printed circuit board and the printed circuit board need not be interpositioned in the gap. Accordingly, the gap can be small and the galvano-magneto effect of the device can be increased. Since the lead frame is not bent, it does not come off and since the area of a part of the device to be exposed on the printed circuit board can be reduced the device will not be damaged.

The device in accordance with the present invention is designed so that the thickness of the semiconductor layer can be easily controlled by making a thin substrate as described above, accordingly, the output characteristic of the galvano-magneto effect element is excellent. Since the device can be constructed so that the cover plate holds the lead frames, the lead frames can be firmly attached to the electrodes and can be almost free from trouble due to vibration applied to the glavano-magneto effect element.

Furthermore, the cover plate is made to be thick so that the magnetic permeability does not vary in accordance with irregularity of thickness and therefore the output of the galvano-magneto effect device does not show irregularity even though there is some irregularity of the thickness of the cover plate. The galvano-magneto effect is large since the magnetic flux concentrating effect on the semiconductor layer is large.

What is claimed is:

1. A galvano-magneto effect device comprising a. a galvano-magneto effect element comprising a thin semiconductor layer made of a magnetism sensing semi-conductor material, b. a substrate, said semiconductor layer being positioned thereon wherein the relationship of the thickness of said semiconductor layer and the substrate is such that the thickness of the semiconductor layer is greater than the range of the thickness error of the substrate when the thickness of the semiconductor layer is controlled by controlling the total thickness of the semiconductor layer and the substrate; and c. a cover plate made of ferrite which is bonded to said galvano-magneto effect element so that said cover plate covers said galvano-magneto effect element and has a thickness such that the magnetic permeability is saturated in accordance with variation of the thickness, wherein said galvano-magneto effect element is interpositioned between said substrate and said cover plate.

2. A galvano-magneto effect device in accordance with claim 1, wherein said galvano-magneto effect element is provided with a plurality of electrodes to which flat connecting parts of conductive lead frames are coupled and said cover plate is bonded to said galvano-magneto effect element so that said electrodes and connecting parts of said lead frames are sandwiched as being overlapped between said cover plate and said substrate.

3. A galvano-magneto effect device in accordance with claim 2, wherein said galvano-magneto effect element is a magneto-resistance effect element having two electrodes.

4. A galvano-magneto effect device in accordance with claim 2, wherein said galvano-magneto effect element is a Hall effect element having four electrodes.

5. A galvano-magneto effect device in accordance with claim 1, wherein the semiconductor layer of said galvano-magneto effect element has a thickness which is in the range from 5 $\mu$ to 20 $\mu$.

6. A galvano-magneto effect device in accordance with claim 5, wherein said substrate has a thickness which is in the range from 60 $\mu$ to 300 $\mu$.

7. A galvano-magneto device in accordance with claim 1, wherein said cover plate has a thickness which is not less than 1 mm.

8. A galvano-magneto effect device in accordance with claim 1, wherein said substrate is made of ferrite.

9. A galvano-magneto effect device in accordance with claim 1, wherein said substrate is made of glass.

* * * * *